US012693321B2

(12) United States Patent
DiPoala

(10) Patent No.: US 12,693,321 B2
(45) Date of Patent: Jul. 28, 2026

(54) UNIDENTIFIED AERIAL PHENOMENA FIELD DISTURBANCE DETECTOR

(71) Applicant: William Samuel DiPoala, Fairport, NY (US)

(72) Inventor: William Samuel DiPoala, Fairport, NY (US)

( * ) Notice: Subject to any disclaimer, the term of this patent is extended or adjusted under 35 U.S.C. 154(b) by 346 days.

(21) Appl. No.: 18/412,783

(22) Filed: Jan. 15, 2024

(65) Prior Publication Data

US 2025/0216577 A1    Jul. 3, 2025

Related U.S. Application Data

(60) Provisional application No. 63/449,595, filed on Mar. 2, 2023.

(51) Int. Cl.
| | |
|---|---|
| *G01R 29/08* | (2006.01) |
| *G01R 33/02* | (2006.01) |
| *G01R 35/00* | (2006.01) |
| *G01V 11/00* | (2006.01) |
| *G06F 3/16* | (2006.01) |
| *G08B 21/18* | (2006.01) |

(52) U.S. Cl.
CPC ..... *G01R 29/0814* (2013.01); *G01R 33/0206* (2013.01); *G01R 35/005* (2013.01); *G01V 11/002* (2013.01); *G06F 3/167* (2013.01); *G08B 21/182* (2013.01)

(58) Field of Classification Search
CPC ............ G01R 29/0814; G01R 33/0206; G01R 35/005; G01V 11/002; G06F 3/167; G08B 21/182; G01S 3/801

USPC .......................................................... 73/602
See application file for complete search history.

(56) References Cited

U.S. PATENT DOCUMENTS

| | | | |
|---|---|---|---|
| 2013/0002275 A1* | 1/2013 | Min .................. | G01R 31/3191 |
| | | | 324/750.02 |
| 2014/0245810 A1 | 9/2014 | Stirling et al. | |
| 2019/0094023 A1* | 3/2019 | Diem ..................... | G01C 17/38 |
| 2020/0049787 A1* | 2/2020 | Guisan .................. | G01N 24/10 |

(Continued)

FOREIGN PATENT DOCUMENTS

UA        20110102241        5/2011

*Primary Examiner* — Brandi N Hopkins
(74) *Attorney, Agent, or Firm* — Michael J. Nickerson

(57) ABSTRACT

An unidentified aerial phenomena field disturbance detector includes an accelerometer configured to measure a gravitational field surrounding the unidentified aerial phenomena field disturbance detector; a magnetometer configured to measure a magnetic field surrounding the unidentified aerial phenomena field disturbance detector; a microwave frequency detector configured to measure a specific band of microwave frequencies surrounding the unidentified aerial phenomena field disturbance detector; a controller; and an optical indicator configured to optically communicate information to a user of the unidentified aerial phenomena field disturbance detector. The controller determines a change in the gravitational field surrounding the unidentified aerial phenomena field disturbance detector when generates gravitational field values are outside a predetermined range of non-event field values. The controller controls the optical indicator to optically communicate the determined change in the gravitational field surrounding the unidentified aerial phenomena field disturbance detector.

24 Claims, 2 Drawing Sheets

(56)     References Cited

U.S. PATENT DOCUMENTS

| | | |
|---|---|---|
| 2021/0142994 A1 | 5/2021 | Kholomeev et al. |
| 2024/0053263 A1 | 2/2024 | Bauer et al. |

* cited by examiner

UNIDENTIFIED AERIAL PHENOMENA FIELD DISTURBANCE DETECTOR

PRIORITY INFORMATION

This application claims priority from U.S. Provisional Patent Application, Ser. No. 63/449,595, filed on Mar. 2, 2023. The entire content of U.S. Provisional Patent Application, Ser. No. 63/449,595, filed on Mar. 2, 2023, is hereby incorporated by reference.

BACKGROUND

Conventionally, an unidentified aerial phenomena was observed visually when an observer happened to be looking at the right place at the right time. The observations were usually not planned and were not detected before the fact to trigger an observer to be aware of such a phenomena occurring.

Since the observation of an unidentified aerial phenomena was happenstance, the observer usually was not prepared to carefully document the unidentified aerial phenomena via video and/or other means. This has led to a variety of observer reports of unidentified aerial phenomena without careful documentation.

Thus, it is desirable to provide a detection system that can detect changes in the environment that are associated with unidentified aerial phenomena so that observation is less happenstance, and the observer has enough of a warning of the unidentified aerial phenomena to make careful documentation of the unidentified aerial phenomena.

It is further desirable to provide a portable detection system that can monitor the gravitational field of a surrounding environment to detect possible anti-gravity propulsion.

It is also desirable to provide a portable detection system that can monitor the magnetic field of a surrounding environment to detect the possible presence of an unidentified aerial phenomena.

Additionally, it is desirable to provide a portable detection system that can monitor specific microwave frequencies in a surrounding environment to detect the possible presence of an unidentified aerial phenomena.

Lastly, it is desirable to provide a portable detection system that can, in combination, monitor the gravitational field of a surrounding environment; monitor the magnetic field of a surrounding environment; and monitor specific microwave frequencies in a surrounding environment to detect the possible presence of an unidentified aerial phenomena.

BRIEF DESCRIPTION OF THE DRAWINGS

The drawings are only for purposes of illustrating various embodiments and are not to be construed as limiting, wherein.

DETAILED DESCRIPTION OF THE DRAWINGS

Figure 1:
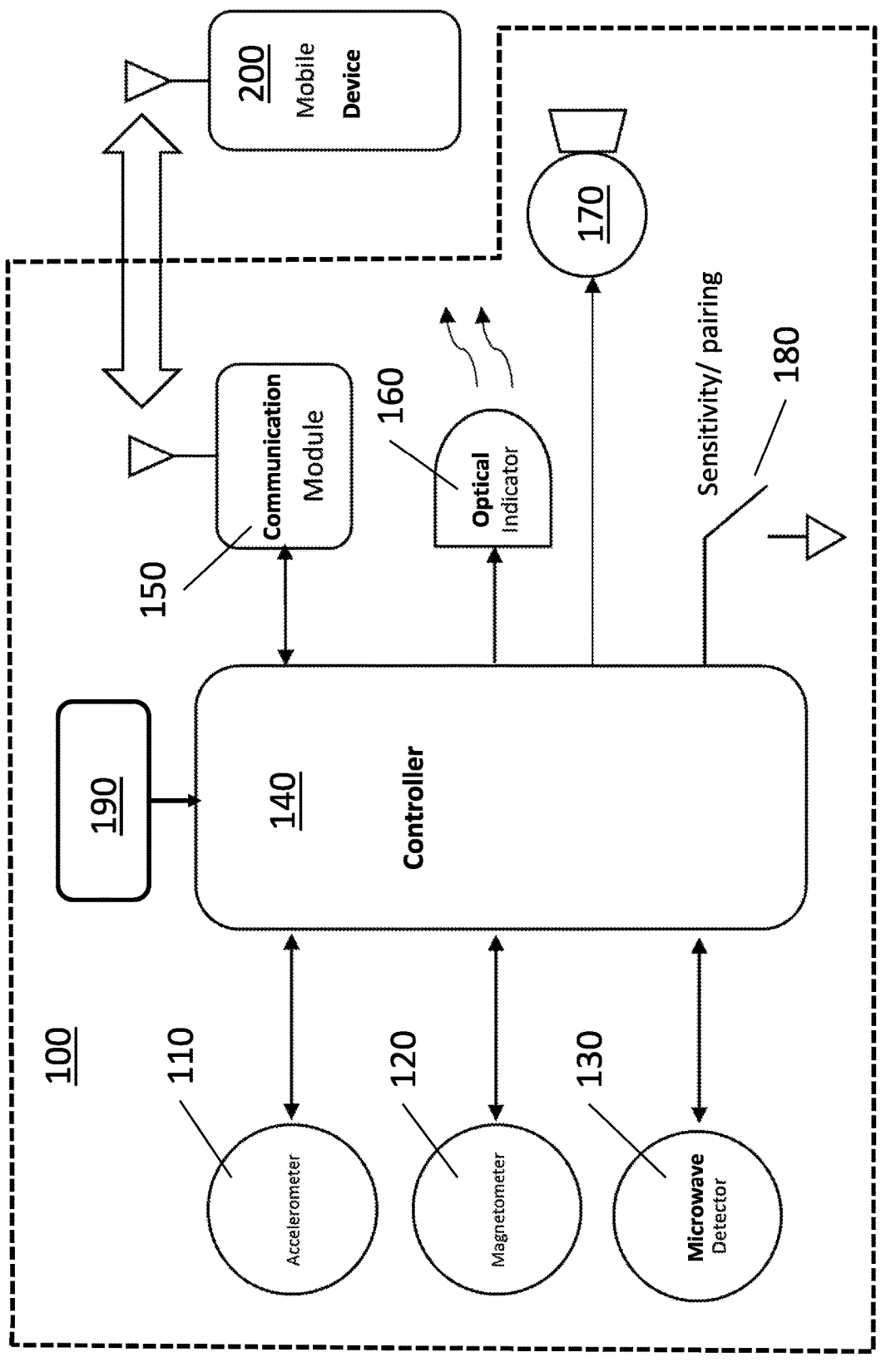
FIG. 1 illustrates a block diagram of an unidentified aerial phenomena field disturbance detector.

For a general understanding, reference is made to the drawings. In the drawings, like references have been used throughout to designate identical or equivalent elements. It is also noted that the drawings may not have been drawn to scale and that certain regions may have been purposely drawn disproportionately so that the features and concepts may be properly illustrated.

In the description below and in the claims, the term, unidentified aerial phenomena, defines an event or object relating to an unidentified flying object, an unidentified aerial phenomena, or an unidentified anomalous phenomena.

FIG. 1 illustrates a block diagram of an unidentified aerial phenomena field disturbance detector. As illustrated in FIG. 1, an unidentified aerial phenomena field disturbance detector 100 includes an accelerometer 110, a magnetometer 120, and a microwave frequency detector 130, each is operatively bi-directionality connected to a controller 140. Controller 140 may be: (1) a controller that includes a processor and memory for storing operation software and associated data; (2) a microcontroller that includes a processor and memory for storing operation software and associated data; (3) an application specific integrated circuit; or (4) firmware.

The unidentified aerial phenomena field disturbance detector 100 further includes an optical indicator 160 for optically or visually communicating information to a user, a communication module 150 for communicating information to a computing or mobile device 200, and an audio indicator 170 for audially communicating information to a user. The communication module 150 may be configured to bi-directionally communicate with a device 200; such as a computing device, a mobile personal computer, a cellphone, or other personal digital device; through a wireless communication protocol, such as WiFi or Bluetooth™, or a hardwired connection.

The unidentified aerial phenomena field disturbance detector 100 also includes a sensitivity/pairing switch 180 to change the sensitivity level (thresholds) of the unidentified aerial phenomena field disturbance detector 100 and to put the unidentified aerial phenomena field disturbance detector 100 in pairing mode for the Wi-Fi communication function of the communication module 150.

Lastly, the unidentified aerial phenomena field disturbance detector 100 may include a directional positional sensor 190 for detecting if the unidentified aerial phenomena field disturbance detector 100 is positioned in an upright position or in an upside-down position. The detected position of the unidentified aerial phenomena field disturbance detector 100 is communicated by the directional positional sensor 190 to the controller 140.

The accelerometer 110 may be a 3-axis accelerometer, such as a MEMS sensor. As noted above, the accelerometer 110 is bidirectionally connected to the controller 140. The accelerometer 110 may be configured by the controller 140 to set the sensitivity thereof or put the accelerometer 110 into sleep mode and wake up mode. A sleep mode may be used to reduce current draw.

The accelerometer 110 communicates the sensors X, Y, Z axis gravitational values to the controller 140. Controller 140 uses these values to set baseline values and to determine if a gravitational field event exists. A gravitational field event is activated, during regular operations, when the measured values exceed gravitational field event threshold levels relative to the baseline values.

The magnetometer 120 may be a MEMS sensor having 3-axes of detection (X-axis, Y-axis, and Z-axis). Magnetometer 120 is bidirectionally connected to controller 140.

Figure 2:
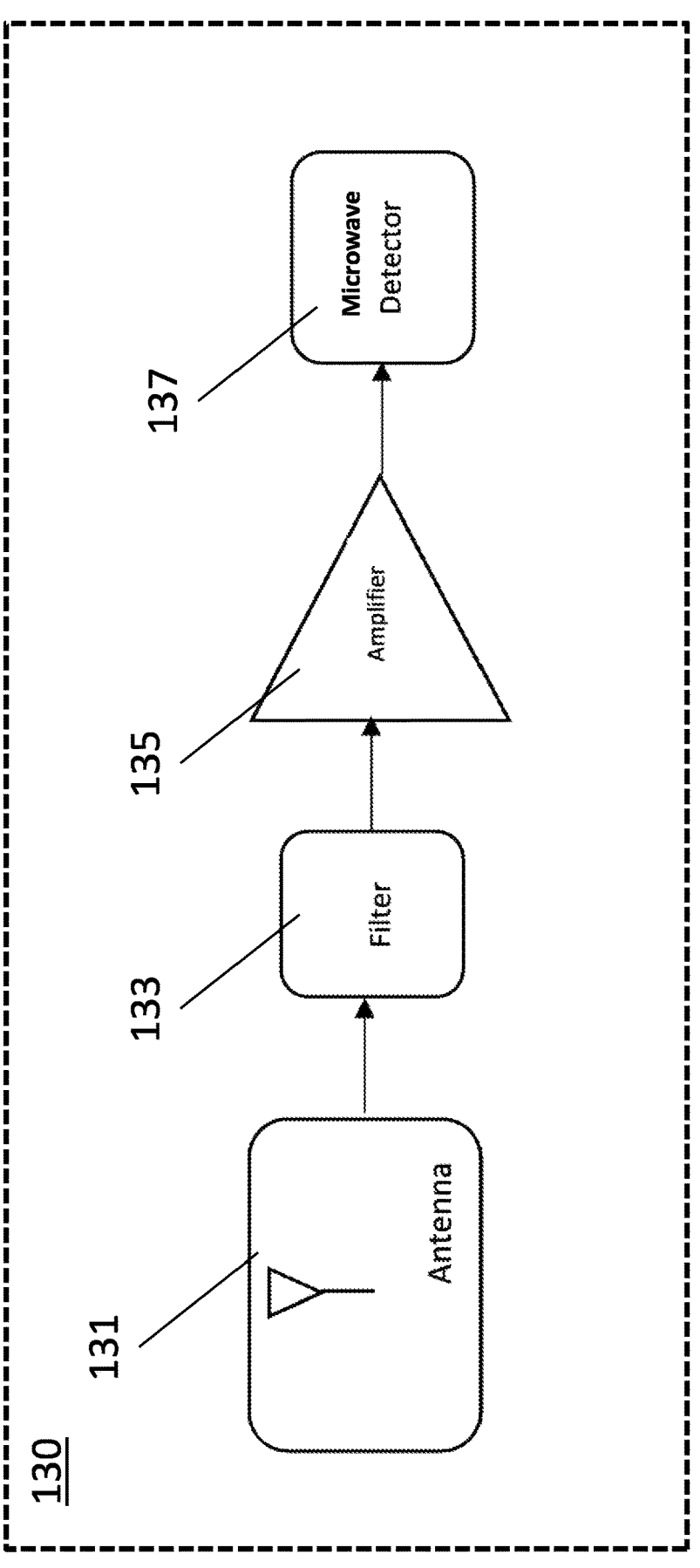
FIG. 2 illustrates a block diagram of a microwave frequency detection circuit for use in the unidentified aerial phenomena field disturbance detector of FIG. 1.

The microwave frequency detector 130 may be a 1.6 GHz RF detector circuit, for which a block diagram thereof is illustrated in FIG. 2. The microwave frequency detector 130 may be designed to be sensitive to a controlled frequency range, such as 1.58 GHz to 1.70 GHz, thereby ignoring microwave frequencies energy outside this range. By limiting the sensitivity to a controlled frequency range, the unidentified aerial phenomena field disturbance detector 100 can reduce false triggering caused by other nearby microwave frequency transmitters like Wi-Fi communications, which can operate at frequencies around 2.4 GHz.

As illustrated in FIG. 2, the microwave frequency detector 130 includes an antenna 131. The antenna 131 may be a wire antenna. Moreover, the wire antenna is more efficient within the desired frequency range of 1.58 GHz to 1.70 GHz.

The antenna 131 is connected to filter 133. The filter 133 may be a ceramic SAW filter. The filter 133 is connected to an amplifier 135 to increase the signal amplitude to a usable level. The output of the amplifier 135 is connected to a microwave frequency detector integrated circuit 137. The microwave frequency detector integrated circuit 137 converts the RF signal to a DC level proportional to the amplitude of the microwave frequency signal.

The output of the microwave frequency detector integrated circuit 137 is connected to an analog-to-digital input (not shown) on the controller 140 of FIG. 1. Controller 140 measures the DC voltage, during the baseline measurement stage, to establish microwave frequency event thresholds. During regular operations, the DC levels are measured against the microwave frequency event thresholds to determine if a microwave frequency event exists.

The various detected events are communicated to the user by the optical indicator 160 and/or the communication module 150. The optical indicator 160 may be an RGB LED device that can display many different colors. The different colors can be used to identify specific events from the different sensors.

To reduce false event triggering, the unidentified aerial phenomena field disturbance detector 100 can be set such that several consecutive measurements need to exceed the threshold(s) before an event is activated. Once an event is detected, the optical indicator 160 pulses the appropriate color to alert the user that a specific event has been detected. A short 500 ms optical pulse every 5 seconds can be used to reduce current consumption. The optical indicator 160 continues with this pulsing scheme until the user resets the unidentified aerial phenomena field disturbance detector 100.

The audio indicator 170 is also activated once for a predetermined period of time to alert the user an event has been detected. The audio indicator 170 may be a piezo electric sounder.

As noted above, the unidentified aerial phenomena field disturbance detector 100 detects changes in measured field levels. Thus, the immediate location and position of the unidentified aerial phenomena field disturbance detector 100 effect the baseline values The baseline field levels (values) are established by the user following a baseline setup procedure, wherein the user flips the unidentified aerial phenomena field disturbance detector 100 upside down and then right side up and places the unidentified aerial phenomena field disturbance detector 100 in its final test position. The unidentified aerial phenomena field disturbance detector 100 delays the reset process for a predetermined amount of time after the user flips the unidentified aerial phenomena field disturbance detector 100 upside down and then right side up to allow the user to put the unidentified aerial phenomena field disturbance detector 100 in the final test position.

The unidentified aerial phenomena field disturbance detector 100 then makes set of baseline measurements on all sensors (accelerometer 110, magnetometer 120, and microwave frequency detector 130) to establish the baseline values.

The measured baseline values are used to establish, for each sensor, a first sensor event threshold $(x_1)$ set just above the measured baseline value for the sensor and a second sensor event threshold $(x_2)$ set just below the measured baseline value for the sensor. The values (NE) between the first $(x_1)$ and second $(x_2)$ sensor event thresholds create a range of "non-event" values (NE). For example, the range of "non-event" values (NE) may be $x_1 \geq NE \geq x_2$ or $x_1 > NE > x_2$.

Thus, any change in a sensor's values that fall outside the determined range of "non-event" values triggers an event. The use of a range of "non-event" values, for each sensor, allows the unidentified aerial phenomena field disturbance detector 100 to be sensitive and avoid triggering false positives.

For example, the accelerometer 110 (gravitational field sensor) most likely measures close to 1 g in the Z-axis and almost 0 g in the other two axes (X-axis and Y-axis). The Z-axis measures approximately 1 g due to the Earth's gravitational field.

For example, if the baseline measurements for the accelerometer 110 (gravitational field sensor) are X-axis=0.04 g, Y-axis=0.06 g, Z-axis=0.90 g, the sensor event thresholds could be set 0.05 g above and below the baseline level for each axis. In this example, the sensor event thresholds levels, for the accelerometer 110 (gravitational field sensor) would be X-axis: +0.09 g, −0.01 g; Y-axis: +1.01 g, +0.01 g; and Z-axis: +0.95 g, +0.8 g.

In other words, the range of "non-event" values $(NE_X)$ for the X-axis could be $+0.09 \text{ g} \geq NE_X \geq -0.01 \text{ g}$ or $+0.09 \text{ g} > NE_X > -0.01$ g; the range of "non-event" values $(NE_Y)$ for the Y-axis could be $+1.01 \text{ g} \geq NE_Y \geq +0.01 \text{ g}$ or $+1.01 \text{ g} > NE_Y > +0.01$ g; and the range of "non-event" values $(NE_Z)$ for the Z-axis could be $+0.95 \text{ g} \geq NE_Z \geq +0.8 \text{ g}$ or $+0.95 \text{ g} > NE_Z > +0.8$ g.

For example, using the above-described range of "non-event" values $(NE_X)$, if a non-baseline measurement value for the X-axis of the accelerometer is +0.1 g, the controller 140 would register a change in the gravitational field surrounding the unidentified aerial phenomena field disturbance detector 100. However, if a non-baseline measurement value for the X-axis of the accelerometer is +0.07 g, the controller 140 would not register a change in the gravitational field surrounding the unidentified aerial phenomena field disturbance detector 100.

Moreover, using the above-described range of "non-event" values $(NE_Y)$, if a non-baseline measurement value aue for the Y-axis of the accelerometer is +1.03 g, the controller 140 would register a change in the gravitational field surrounding the unidentified aerial phenomena field disturbance detector 100. However, if a non-baseline measurement value for the Y-axis of the accelerometer is +0.07 g, the controller 140 would not register a change in the gravitational field surrounding the unidentified aerial phenomena field disturbance detector 100.

Lastly, using the above-described range of "non-event" values $(NE_Z)$, if a non-baseline measurement value for the Z-axis of the accelerometer is +0.98 g, the controller 140 would register a change in the gravitational field surrounding the unidentified aerial phenomena field disturbance detector 100. However, if a non-baseline measurement value for the Z-axis of the accelerometer is +0.92 g, the controller 140 would not register a change in the gravitational field surrounding the unidentified aerial phenomena field disturbance detector 100.

In another embodiment, there must be more than a predetermined number of non-baseline measurement values for an axis outside the above-described range of "non-event" values over than a predetermined amount of time. In other words, for example, there must be more than four non-baseline measurement values for an axis, each having a value outside the above-described range of "non-event" values, during a window of three seconds.

For example, using the above-described range of "non-event" values ($NE_X$), the predetermined number of non-baseline measurement values, and the predetermined amount of time, if the non-baseline measurement values for the X-axis of the accelerometer, during a window of three seconds, are: +0.1 g, +0.11 g, −0.01 g, −0.02 g, +0.115 g, and −0.015 g; the controller 140 would register a change in the gravitational field surrounding the unidentified aerial phenomena field disturbance detector 100 because there were five the non-baseline measurement values for the X-axis of the accelerometer outside the range of "non-event" values ($NE_X$) during the three second window.

However, if a non-baseline measurement values for the X-axis of the accelerometer, during a window of three seconds, are: +0.07 g, +0.11 g, −0.01 g, −0.02 g, +0.115 g, and −0.015 g; the controller 140 would not register a change in the gravitational field surrounding the unidentified aerial phenomena field disturbance detector 100 because there were not more than four non-baseline measurement values for the X-axis of the accelerometer outside the range of "non-event" values ($NE_X$) during the three second window.

Moreover, for example, using the above-described range of "non-event" values ($NE_Y$), the predetermined number of non-baseline measurement values, and the predetermined amount of time, if the non-baseline measurement values for the Y-axis of the accelerometer, during a window of three seconds, are: +1.02 g, +1.04 g, +0.01 g, −0.02 g, +1.015 g, and −0.015 g; the controller 140 would register a change in the gravitational field surrounding the unidentified aerial phenomena field disturbance detector 100 because there were five the non-baseline measurement values for the Y-axis of the accelerometer outside the range of "non-event" values ($NE_Y$) during the three second window.

However, if a non-baseline measurement values for the X-axis of the accelerometer, during a window of three seconds, are: +0.07 g, +0.11 g, −0.01 g, +0.02 g, +0.115 g, and −0.015 g; the controller 140 would not register a change in the gravitational field surrounding the unidentified aerial phenomena field disturbance detector 100 because there were not more than four non-baseline measurement values for the Y-axis of the accelerometer outside the range of "non-event" values ($NE_Y$) during the three second window.

Lastly, for example, using the above-described range of "non-event" values ($NE_Z$), the predetermined number of non-baseline measurement values, and the predetermined amount of time, if the non-baseline measurement values for the Z-axis of the accelerometer, during a window of three seconds, are: +1.02 g, +1.04 g, +0.90 g, −0.02 g, +1.015 g, and −0.015 g; the controller 140 would register a change in the gravitational field surrounding the unidentified aerial phenomena field disturbance detector 100 because there were five the non-baseline measurement values for the Z-axis of the accelerometer outside the range of "non-event" values ($NE_Z$) during the three second window.

However, if a non-baseline measurement values for the Z-axis of the accelerometer, during a window of three seconds, are: +0.9 g, +0.11 g, −0.01 g, +0.92 g, +0.115 g, and −0.015 g; the controller 140 would not register a change in the gravitational field surrounding the unidentified aerial phenomena field disturbance detector 100 because there were not more than four non-baseline measurement values for the Z-axis of the accelerometer outside the range of "non-event" values ($NE_Z$) during the three second window.

Without the baseline measurements, the threshold levels for all axes would need to be set above all the expected position levels. This could mean that any axis may have 1 g on it from the Earth's gravitational field. The thresholds on all 3 axes would need to be +/−1.05 g, and this would significantly reduce the sensitivity of the unidentified aerial phenomena field disturbance detector 100.

The above-described methods for determining a change in the gravitational field surrounding the unidentified aerial phenomena field disturbance detector 100 can be used in determining a change in the magnetic field surrounding the unidentified aerial phenomena field disturbance detector 100.

Moreover, the above-described methods for determining a change in the gravitational field surrounding the unidentified aerial phenomena field disturbance detector 100 can be used in determining a change in the microwave frequencies surrounding the unidentified aerial phenomena field disturbance detector 100.

The other sensors (magnetometer 120 and microwave frequency detector 130) are also affected by the location, environment, and position of the unidentified aerial phenomena field disturbance detector 100 and benefit by having making baseline reference measurement. The baseline measurements also allow for the compensation of internal circuit noise sources and external noise sources.

As noted above, a sensor baseline measurement is made when the user first places the unidentified aerial phenomena field disturbance detector 100 in a test location. The baseline sensor data is averaged to obtain an accurate ambient (position) level.

The accelerometer 110 (gravitational field sensor) and the magnetometer 120 (magnetic field sensor) may have 3 independent axis of measurements. During calibration, preferably, all axis of accelerometer 110 (gravitational field sensor) and the magnetometer 120 (magnetic field sensor) are measured 10 times in a 5 second period. The 10 samples are then averaged to determine the baseline levels.

The event thresholds are set above and below the baseline levels. The threshold levels are set to be adequately above the noise floor to prevent false positives. Both internal and external noise sources are considered For example, the magnetic field sensor threshold for the magnetometer 120 (magnetic field sensor) may be +/−8 mG (milligauss); the gravitational field sensor threshold for the accelerometer 110 (gravitational field sensor) may be +/−25 mg; and the microwave frequency sensor threshold for the microwave frequency detector 130 (a 1.6 GHz microwave frequency detector (electromagnetic field) sensor) may be +/−2 dB. It is noted that other threshold values can be used such as +/−50 mg for the accelerometer 110, +/−16 mG for the magnetometer 120, and +/−4 dB for the microwave frequency detector 130; or +/−125 mg for the accelerometer 110, +/−40 mG for the magnetometer 120, and +/−10 dB for the microwave frequency detector 130.

The user can set different sensitivity levels if false events are triggered and cannot be eliminated by moving the location of the unidentified aerial phenomena field disturbance detector 100.

To account for drift in the sensors due to temperature, aging, and environmental influences, the baseline level can be adjusted slowly using a 64-point running average of the 5 second sensor interval measurement. This adjustment is made after the baseline measurement during the normal sensor measurement period.

The sensor threshold levels can be raised to when a Wi-Fi communications are used to prevent false triggering caused by electromagnetic interference from the Wi-Fi microwave.

It is noted that to reduce current consumption, the sensors can be put into a sleep mode in between measurements.

When making non-baseline measurements, the axis-based sensors are measured once every 5 seconds. The unidentified aerial phenomena field disturbance detector 100 can be configured such that a sensor's signal levels must outside the established threshold range for 5 consecutive measurements to trigger an event, thereby reducing false positive activations from transient noise sources Each axis-based sensor is counted independently. The 5 consecutive trigger measurements can be a mix of being above or below the established threshold range. This allows detection from sources that can cause the field to swing wildly in a positive and negative direction. When a signal is measured to be outside a threshold range, the sensor measurement interval may be reduced to 0.5 seconds to improve the response time.

It is noted that the baseline reset/activation function can also be initiated, over a communication network, using an application on a computing or mobile device 200.

It is noted that the baseline reset/activation function is initiated by turning the unidentified aerial phenomena field disturbance detector 100 upside down for a predetermined amount of time. In other words, the baseline reset/activation function is initiated, when the directional positional sensor 190 detects that the unidentified aerial phenomena field disturbance detector 100 has been turned upside down for a predetermined amount of time; such as until the optical indicator 160 blinks white twice and the audio indicator 170 chirps twice.

The unidentified aerial phenomena field disturbance detector 100 will start a test and calibration (baseline) sequence when the directional positional sensor 190 detects that the unidentified aerial phenomena field disturbance detector 100 has been turned back upright.

When the baseline reset/activation function, initially, the optical indicator 160 flashes (pulses) to let the user know the unidentified aerial phenomena field disturbance detector 100 will be making baseline measurements and allow enough time for the user to pace the unidentified aerial phenomena field disturbance detector 100 in its final test location/position.

Thereafter, the optical indicator 160 stays active on red for a predetermined period, indicating the unidentified aerial phenomena field disturbance detector 100 is making the baseline measurements and to not touch to move the unidentified aerial phenomena field disturbance detector 100. After the predetermined period, the unidentified aerial phenomena field disturbance detector 100 goes into its sensor monitoring phase and compares the measured values to the threshold levels (baseline measurements).

The accelerometer 110 (gravitational field sensor) is utilized to measure the potential anti-gravity propulsion that an unidentified aerial phenomena may be using. The anti-gravity propulsion would cause a change in the surrounding gravitational field that can be measured by the accelerometer 110 (gravitational field sensor), thereby detecting the possible presence of an unidentified aerial phenomena.

Magnetometer 120 (magnetic field sensor) is utilized to measure potential changes in the magnetic field that may be caused by an unidentified aerial phenomena, thereby detecting the possible presence of an unidentified aerial phenomena.

The microwave frequency detector 130 (a 1.6 GHz microwave frequency detector (electromagnetic field) sensor) is utilized to measure possible microwave frequency emissions (in the 1.6 GHz band) associated with an unidentified aerial phenomena, thereby detecting the possible presence of an unidentified aerial phenomena.

The optical indicator 160 is used to communicate events and other information to the user.

For example, when an event is detected, the optical indicator 160 may flash ON/OFF once per second for a predetermined amount of time, and then flash a short pulse every 5 seconds, for a second predetermined amount of time, to extend battery life.

In another example, the optical indicator 160 may flash red when a gravitational field event is detected. The optical indicator 160 may flash green when a magnetic field event is detected. The optical indicator 160 may flash blue when a microwave frequency event is detected.

In another embodiment, the unidentified aerial phenomena field disturbance detector 100 may be configured to communicate when a higher probability that an unidentified aerial phenomena is occurring. In this embodiment, the optical indicator 160 may flash a sequence of different colors or another single color, such as orange, indicating that more than one sensor has measured a trigger event, thereby conveying to the user of a higher probability that an unidentified aerial phenomena is occurring.

The unidentified aerial phenomena field disturbance detector 100 may be configured to give certain weight to the detected events such that the optical indicator 160 may flash a sequence of different colors or another single color, such as orange, only when the weighted detected events are above a predetermined threshold.

With respect to non-event information, the optical indicator 160 may: light red when the accelerometer 110 (gravitational field sensor) is working properly; light green when the magnetometer 120 (magnetic field sensor) is working properly; light blue when the microwave frequency detector 130 (a 1.6 GHz microwave frequency detector (electromagnetic field) sensor) is working properly; light yellow when the battery level of the unidentified aerial phenomena field disturbance detector 100 is good; and may light purple when the communication module 150 is working.

After calibration, optical indicator 160 may: light red when the sensitivity is set at a high level; light green when the sensitivity is set at a medium level; and light blue when the sensitivity is set at a low level.

The audio indicator 170 is used to audially communicate events and other information to the user.

For example, when an event is detected, the audio indicator 170 may chirp a predetermined number of times.

When using the unidentified aerial phenomena field disturbance detector 100, collecting the event type data can be useful information in the study of unidentified aerial phenomena. An event activation notifies the user that an unidentified aerial phenomena event is happening and to look in the sky and surrounding area to see if there is visible evidence of an unidentified aerial phenomena. The user can then collect additional data like photographic and infra-red imagery. Since these events happen very infrequently, the user does not need to spend many hours looking into the sky for an unidentified aerial phenomena event. Additionally, the event type data can be shared in real-time to others so that they can look in the sky and surrounding area to see if there is visible evidence of an unidentified aerial phenomena.

An unidentified aerial phenomena field disturbance detector, comprises an accelerometer configured to measure a gravitational field surrounding the unidentified aerial phenomena field disturbance detector and generate associated gravitational field values; a magnetometer configured to measure a magnetic field surrounding the unidentified aerial phenomena field disturbance detector and generate associated magnetic field values; a microwave frequency detector configured to measure a specific band of microwave frequencies surrounding the unidentified aerial phenomena field disturbance detector and to generate associated microwave frequency values; a controller operatively connected to the accelerometer, the magnetometer, and the microwave frequency detector; and an optical indicator, operatively connected to the controller, configured to optically communicate information to a user of the unidentified aerial phenomena field disturbance detector; the controller determining a change in the gravitational field surrounding the unidentified aerial phenomena field disturbance detector when the generate associated gravitational field values are outside a predetermined range of non-event gravitational field values; the controller controlling the optical indicator to optically communicate the determined change in the gravitational field surrounding the unidentified aerial phenomena field disturbance detector.

The controller may determine a change in the magnetic field surrounding the unidentified aerial phenomena field disturbance detector when the generate associated magnetic field values are outside a predetermined range of non-event magnetic field values; the controller may control the optical indicator to optically communicate the determined change in the magnetic field surrounding the unidentified aerial phenomena field disturbance detector.

The controller may determine a change in the microwave frequencies surrounding the unidentified aerial phenomena field disturbance detector when the generate associated microwave frequency values are outside a predetermined range of non-event microwave frequency values; the controller may control the optical indicator to optically communicate the determined change in the microwave frequencies surrounding the unidentified aerial phenomena field disturbance detector.

The predetermined range of non-event gravitational field values may be determined by the controller during a calibration operation by measuring gravitational field values to establish a baseline value, the predetermined range of non-event gravitational field values being the baseline value plus and minus a gravitational field threshold value, the gravitational field threshold value being associated with a desired sensitivity.

The predetermined range of non-event magnetic field values may be determined by the controller during a calibration operation by measuring magnetic field values to establish a baseline value, the predetermined range of non-event magnetic field values being the baseline value plus and minus a magnetic field threshold value, the magnetic field threshold value being associated with a desired sensitivity.

The predetermined range of non-event microwave frequency values may be determined by the controller during a calibration operation by measuring microwave frequency values to establish a baseline value, the predetermined range of non-event microwave frequency values being the baseline value plus and minus a microwave frequency threshold value, the microwave frequency threshold value being associated with a desired sensitivity.

The accelerometer may be a 3-axis gravitational field sensor for measuring gravitational fields in an X-axis, Y-axis, and a Z-axis.

The magnetometer may be magnetic field sensor for measuring magnetic fields in an X-axis, Y-axis, and a Z-axis.

The microwave frequency detector may be a 1.6 GHz microwave frequency detector.

The detector may comprise an audio indicator configured to audially communicate information to the user of the unidentified aerial phenomena field disturbance detector.

The detector may comprise a directional positional sensor for detecting if the unidentified aerial phenomena field disturbance detector is positioned in an upright position or in an upside-down position.

The detector controller may start a calibration operation after the directional positional sensor detects that the unidentified aerial phenomena field disturbance detector has been positioned in the upside-down position for a predetermined period of time.

The 1.6 GHz microwave frequency detector may include an antenna, a SAW filter, and an amplifier.

The detector may comprise a communication module configured to wireless communicate with a mobile device.

The predetermined range of non-event gravitational field values may include an X-axis predetermined range of non-event gravitational field values, a Y-axis predetermined range of non-event gravitational field values, and a Z-axis predetermined range of non-event gravitational field values.

The predetermined range of non-event magnetic field values may include an X-axis predetermined range of non-event magnetic field values, a Y-axis predetermined range of non-event magnetic field values, and a Z-axis predetermined range of non-event magnetic field values.

The gravitational field threshold value may be in a range from 1 mg to 50 mg. The magnetic field threshold value may be in a range from 1 mG to 50 mG.

The microwave frequency threshold value may be in a range from 1 dB to 10 dB.

The controller may power down the accelerometer between measurements of the gravitational field surrounding the unidentified aerial phenomena field disturbance detector, powers down the magnetometer between measurements of the magnetic field surrounding the unidentified aerial phenomena field disturbance detector, and powers down the microwave frequency detector between measurements of the microwave frequencies surrounding the unidentified aerial phenomena field disturbance detector The controller may determine the change in the gravitational field surrounding the unidentified aerial phenomena field disturbance detector when a predetermined number of generated associated gravitational field values are outside a predetermined range of non-event gravitational field values during a predetermined amount of time.

The controller may determine the change in the magnetic field surrounding the unidentified aerial phenomena field disturbance detector when a predetermined number of generated associated magnetic field values are outside a predetermined range of non-event magnetic field values during a predetermined amount of time.

The controller may determine the change in the microwave frequencies surrounding the unidentified aerial phenomena field disturbance detector when a predetermined number of generated associated microwave frequencies values are outside a predetermined range of non-event microwave frequencies values during a predetermined amount of time.

An unidentified aerial phenomena field disturbance detector, comprises: an accelerometer configured to measure a gravitational field surrounding the unidentified aerial phenomena field disturbance detector and generate associated gravitational field values; a controller operatively connected to the accelerometer; and an optical indicator, operatively connected to the controller, configured to optically communicate information to a user of the unidentified aerial phenomena field disturbance detector; the controller determining a change in the gravitational field surrounding the unidentified aerial phenomena field disturbance detector when the generate associated gravitational field values are outside a predetermined range of non-event gravitational field values; the controller controlling the optical indicator to optically communicate the determined change in the gravitational field surrounding the unidentified aerial phenomena field disturbance detector.

The predetermined range of non-event gravitational field values may be determined by the controller during a calibration operation by measuring gravitational field values to establish a baseline value, the predetermined range of non-event gravitational field values being the baseline value plus and minus a gravitational field threshold value, the gravitational field threshold value being associated with a desired sensitivity.

The accelerometer may be a 3-axis gravitational field sensor for measuring gravitational fields in an X-axis, Y-axis, and a Z-axis.

The detector may further comprise an audio indicator configured to audially communicate information to the user of the unidentified aerial phenomena field disturbance detector.

The detector may further comprise a directional positional sensor for detecting if the unidentified aerial phenomena field disturbance detector is positioned in an upright position or in an upside-down position.

The controller may start a calibration operation after the directional positional sensor detects that the unidentified aerial phenomena field disturbance detector has been positioned in the upside-down position for a predetermined period of time.

The detector may further comprise a communication module configured to wireless communicate with a mobile device.

The predetermined range of non-event gravitational field values may include an X-axis predetermined range of non-event gravitational field values, a Y-axis predetermined range of non-event gravitational field values, and a Z-axis predetermined range of non-event gravitational field values.

The gravitational field threshold value may be in a range from 1 mg to 50 mg.

The controller may power down the accelerometer between measurements of the gravitational field surrounding the unidentified aerial phenomena field disturbance detector.

The controller may determine the change in the gravitational field surrounding the unidentified aerial phenomena field disturbance detector when a predetermined number of generated associated gravitational field values are outside a predetermined range of non-event gravitational field values during a predetermined amount of time.

The detector may further comprise a magnetometer configured to measure a magnetic field surrounding the unidentified aerial phenomena field disturbance detector and generate associated magnetic field values; the controller determining a change in the magnetic field surrounding the unidentified aerial phenomena field disturbance detector when the generate associated magnetic field values are outside a predetermined range of non-event magnetic field values; the controller controlling the optical indicator to optically communicate the determined change in the magnetic field surrounding the unidentified aerial phenomena field disturbance detector.

The detector may further comprise a directional positional sensor for detecting if the unidentified aerial phenomena field disturbance detector is positioned in an upright position or in an upside-down position.

The detector may further comprise a directional positional sensor for detecting if the unidentified aerial phenomena field disturbance detector is positioned in an upright position or in an upside-down position.

The accelerometer may be a 3-axis gravitational field sensor for measuring gravitational fields in an X-axis, Y-axis, and a Z-axis.

The predetermined range of non-event magnetic field values may be determined by the controller during a calibration operation by measuring magnetic field values to establish a baseline value, the predetermined range of non-event magnetic field values being the baseline value plus and minus a magnetic field threshold value, the magnetic field threshold value being associated with a desired sensitivity.

The magnetometer may be a magnetic field sensor for measuring magnetic fields in an X-axis, Y-axis, and a Z-axis.

The predetermined range of non-event magnetic field values may include an X-axis predetermined range of non-event magnetic field values, a Y-axis predetermined range of non-event magnetic field values, and a Z-axis predetermined range of non-event magnetic field values.

The magnetic field threshold value may be in a range from 1 mG to 50 mG.

The controller may power down the magnetometer between measurements of the magnetic field surrounding the unidentified aerial phenomena field disturbance detector.

The controller may determine the change in the magnetic field surrounding the unidentified aerial phenomena field disturbance detector when a predetermined number of generated associated magnetic field values are outside a predetermined range of non-event magnetic field values during a predetermined amount of time.

The detector may further comprise a microwave frequency detector configured to measure a specific band of microwave frequencies surrounding the unidentified aerial phenomena field disturbance detector and to generate associated microwave frequency values; the controller determining a change in the microwave frequencies surrounding the unidentified aerial phenomena field disturbance detector when the generate associated microwave frequency values are outside a predetermined range of non-event microwave frequency values; the controller controlling the optical indicator to optically communicate the determined change in the microwave frequencies surrounding the unidentified aerial phenomena field disturbance detector.

The predetermined range of non-event microwave frequency values may be determined by the controller during a calibration operation by measuring microwave frequency values to establish a baseline value, the predetermined range of non-event microwave frequency values being the baseline value plus and minus a microwave frequency threshold value, the microwave frequency threshold value being associated with a desired sensitivity.

The microwave frequency detector may be a 1.6 GHz microwave frequency detector having a range of 1.58 GHz to 1.7 GHZ.

The 1.6 GHz microwave frequency detector may include an antenna, a SAW filter, and an amplifier.

The microwave frequency threshold value may be in a range from 1 dB to 10 dB.

The controller may power down the microwave frequency detector between measurements of the microwave frequency surrounding the unidentified aerial phenomena field disturbance detector.

The controller may determine the change in the microwave frequencies surrounding the unidentified aerial phenomena field disturbance detector when a predetermined number of generated associated microwave frequency values are outside a predetermined range of non-event microwave frequency values during a predetermined amount of time.

An unidentified aerial phenomena field disturbance detector, comprises a microwave frequency detector configured to measure a specific band of microwave frequencies surrounding the unidentified aerial phenomena field disturbance detector and to generate associated microwave frequency values; a controller operatively connected to the microwave frequency detector; and an optical indicator, operatively connected to the controller, configured to optically communicate information to a user of the unidentified aerial phenomena field disturbance detector; the controller determining a change in the microwave frequencies surrounding the unidentified aerial phenomena field disturbance detector when the generate associated microwave frequency values are outside a predetermined range of non-event microwave frequency values; the controller controlling the optical indicator to optically communicate the determined change in the microwave frequencies surrounding the unidentified aerial phenomena field disturbance detector.

The predetermined range of non-event microwave frequency values may be determined by the controller during a calibration operation by measuring microwave frequency values to establish a baseline value, the predetermined range of non-event microwave frequency values being the baseline value plus and minus a microwave frequency threshold value, the microwave frequency threshold value being associated with a desired sensitivity.

The microwave frequency detector may be a 1.6 GHz microwave frequency detector having a range of 1.58 GHz to 1.7 GHZ.

The 1.6 GHz microwave frequency detector may include an antenna, a SAW filter, and an amplifier.

The microwave frequency threshold value may be in a range from 1 dB to 10 dB.

The controller may power down the microwave frequency detector between measurements of the microwave frequency surrounding the unidentified aerial phenomena field disturbance detector.

The controller may determine the change in the microwave frequencies surrounding the unidentified aerial phenomena field disturbance detector when a predetermined number of generated associated microwave frequency values are outside a predetermined range of non-event microwave frequency values during a predetermined amount of time.

The detector may further comprise a magnetometer configured to measure a magnetic field surrounding the unidentified aerial phenomena field disturbance detector and generate associated magnetic field values; the controller determining a change in the magnetic field surrounding the unidentified aerial phenomena field disturbance detector when the generate associated magnetic field values are outside a predetermined range of non-event magnetic field values; the controller controlling the optical indicator to optically communicate the determined change in the magnetic field surrounding the unidentified aerial phenomena field disturbance detector.

The predetermined range of non-event magnetic field values may be determined by the controller during a calibration operation by measuring magnetic field values to establish a baseline value, the predetermined range of non-event magnetic field values being the baseline value plus and minus a magnetic field threshold value, the magnetic field threshold value being associated with a desired sensitivity.

The magnetometer may be a magnetic field sensor for measuring magnetic fields in an X-axis, Y-axis, and a Z-axis.

The predetermined range of non-event magnetic field values may include an X-axis predetermined range of non-event magnetic field values, a Y-axis predetermined range of non-event magnetic field values, and a Z-axis predetermined range of non-event magnetic field values.

The magnetic field threshold value may be in a range from 1 mG to 50 mG.

The controller may power down the magnetometer between measurements of the magnetic field surrounding the unidentified aerial phenomena field disturbance detector.

The controller may determine the change in the magnetic field surrounding the unidentified aerial phenomena field disturbance detector when a predetermined number of generated associated magnetic field values are outside a predetermined range of non-event magnetic field values during a predetermined amount of time.

It will be appreciated that variations of the above-disclosed embodiments and other features and functions, or alternatives thereof, may be desirably combined into many other different systems or applications. Also, various presently unforeseen or unanticipated alternatives, modifications, variations or improvements therein may be subsequently made by those skilled in the art which are also intended to be encompassed by the description above and the following claims.

What is claimed is:

1. An unidentified aerial phenomena field disturbance detector, comprising:

an accelerometer configured to measure a gravitational field surrounding the unidentified aerial phenomena field disturbance detector and generate associated gravitational field values;

a magnetometer configured to measure a magnetic field surrounding the unidentified aerial phenomena field disturbance detector and generate associated magnetic field values;

a microwave frequency detector configured to measure a specific band of microwave frequencies surrounding the unidentified aerial phenomena field disturbance detector and to generate associated microwave frequency values;

a controller operatively connected to said accelerometer, said magnetometer, and said microwave frequency detector; and an optical indicator, operatively connected to said controller, configured to optically communicate information to a user of the unidentified aerial phenomena field disturbance detector;

said controller determining a change in the gravitational field surrounding the unidentified aerial phenomena field disturbance detector when the generated associated gravitational field values are outside a predetermined range of non-event gravitational field values;

said controller controlling said optical indicator to optically communicate the determined change in the gravitational field surrounding the unidentified aerial phenomena field disturbance detector.

2. The detector as claimed in claim 1, wherein said controller determines a change in the magnetic field surrounding the unidentified aerial phenomena field disturbance detector when the generate associated magnetic field values are outside a predetermined range of non-event magnetic field values;

said controller controlling said optical indicator to optically communicate the determined change in the magnetic field surrounding the unidentified aerial phenomena field disturbance detector.

3. The detector as claimed in claim 2, wherein said controller determines a change in the microwave frequencies surrounding the unidentified aerial phenomena field disturbance detector when the generate associated microwave frequency values are outside a predetermined range of non-event microwave frequency values;

said controller controlling said optical indicator to optically communicate the determined change in the microwave frequencies surrounding the unidentified aerial phenomena field disturbance detector.

4. The detector as claimed in claim 2, wherein said predetermined range of non-event magnetic field values is determined by said controller during a calibration operation by measuring magnetic field values to establish a baseline value, said predetermined range of non-event magnetic field values being the baseline value plus and minus a magnetic field threshold value, said magnetic field threshold value being associated with a desired sensitivity.

5. The detector as claimed in claim 4, wherein said magnetic field threshold value is in a range from 1 mG to 50 mG.

6. The detector as claimed in claim 4, wherein said microwave frequency threshold value is in a range from 1 dB to 10 dB.

7. The detector as claimed in claim 2, wherein said predetermined range of non-event magnetic field values includes an X-axis predetermined range of non-event magnetic field values, a Y-axis predetermined range of non-event magnetic field values, and a Z-axis predetermined range of non-event magnetic field values.

8. The detector as claimed in claim 2, wherein said controller determines the change in the magnetic field surrounding the unidentified aerial phenomena field disturbance detector when a predetermined number of generated associated magnetic field values are outside a predetermined range of non-event magnetic field values during a predetermined amount of time.

9. The detector as claimed in claim 1, wherein said controller determines a change in the microwave frequencies surrounding the unidentified aerial phenomena field disturbance detector when the generate associated microwave frequency values are outside a predetermined range of non-event microwave frequency values;

said controller controlling said optical indicator to optically communicate the determined change in the microwave frequencies surrounding the unidentified aerial phenomena field disturbance detector.

10. The detector as claimed in claim 9, wherein said predetermined range of non-event microwave frequency values is determined by said controller during a calibration operation by measuring microwave frequency values to establish a baseline value, said predetermined range of non-event microwave frequency values being the baseline value plus and minus a microwave frequency threshold value, said microwave frequency threshold value being associated with a desired sensitivity.

11. The detector as claimed in claim 9, wherein said controller determines the change in the microwave frequencies surrounding the unidentified aerial phenomena field disturbance detector when a predetermined number of generated associated microwave frequencies values are outside a predetermined range of non-event microwave frequencies values during a predetermined amount of time.

12. The detector as claimed in claim 1, wherein said predetermined range of non-event gravitational field values is determined by said controller during a calibration operation by measuring gravitational field values to establish a baseline value, said predetermined range of non-event gravitational field values being the baseline value plus and minus a gravitational field threshold value, said gravitational field threshold value being associated with a desired sensitivity.

13. The detector as claimed in claim 12, wherein said gravitational field threshold value is in a range from 1 mg to 50 mg.

14. The detector as claimed in claim 1, wherein said accelerometer is a 3-axis gravitational field sensor for measuring gravitational fields in an X-axis, Y-axis, and a Z-axis.

15. The detector as claimed in claim 1, wherein said magnetometer is a magnetic field sensor for measuring magnetic fields in an X-axis, Y-axis, and a Z-axis.

16. The detector as claimed in claim 1, wherein said microwave frequency detector is a 1.6 GHz microwave frequency detector having a range of 1.58 GHz to 1.7 GHZ.

17. The detector as claimed in claim 16, wherein said 1.6 GHz microwave frequency detector includes an antenna, a SAW filter, and an amplifier.

18. The detector as claimed in claim 1, further comprising an audio indicator configured to audially communicate information to the user of the unidentified aerial phenomena field disturbance detector.

19. The detector as claimed in claim 1, further comprising a directional positional sensor for detecting if the unidentified aerial phenomena field disturbance detector is positioned in an upright position or in an upside-down position.

20. The detector as claimed in claim 19, wherein said controller starts a calibration operation after said directional positional sensor detects that the unidentified aerial phenomena field disturbance detector has been positioned in the upside-down position for a predetermined period of time.

21. The detector as claimed in claim 1, further comprising a communication module configured to wireless communicate with a mobile device.

22. The detector as claimed in claim 1, wherein said predetermined range of non-event gravitational field values includes an X-axis predetermined range of non-event gravitational field values, a Y-axis predetermined range of non-event gravitational field values, and a Z-axis predetermined range of non-event gravitational field values.

23. The detector as claimed in claim 1, wherein said controller powers down said accelerometer between measurements of the gravitational field surrounding the unidentified aerial phenomena field disturbance detector, powers down said magnetometer between measurements of the magnetic field surrounding the unidentified aerial phenomena field disturbance detector, and powers down said microwave frequency detector between measurements of the microwave frequencies surrounding the unidentified aerial phenomena field disturbance detector.

24. The detector as claimed in claim 1, wherein said controller determines the change in the gravitational field surrounding the unidentified aerial phenomena field disturbance detector when a predetermined number of generated associated gravitational field values are outside a predetermined range of non-event gravitational field values during a predetermined amount of time.

* * * * *